US006689418B2

United States Patent
Olgado et al.

(10) Patent No.: US 6,689,418 B2
(45) Date of Patent: Feb. 10, 2004

(54) APPARATUS FOR WAFER RINSE AND CLEAN AND EDGE ETCHING

(75) Inventors: Donald J. K. Olgado, Palo Alto, CA (US); Avi Tepman, Cupertino, CA (US); Yeuk-Fai Edwin Mok, San Francisco, CA (US); Arnold V. Kholodenko, San Francisco, CA (US)

(73) Assignee: Applied Materials Inc., Santa Clara, CA (US)

( * ) Notice: Subject to any disclaimer, the term of this patent is extended or adjusted under 35 U.S.C. 154(b) by 175 days.

(21) Appl. No.: 09/922,130

(22) Filed: Aug. 3, 2001

(65) Prior Publication Data

US 2003/0024557 A1 Feb. 6, 2003

(51) Int. Cl.$^7$ .................................................. B05D 3/12
(52) U.S. Cl. ....................... 427/240; 427/352; 427/353; 427/425; 427/443.2; 118/52; 118/320; 118/416
(58) Field of Search ................................ 427/240, 425, 427/430.1, 434.2, 352, 353; 118/52, 320, 54, 416

(56) References Cited

U.S. PATENT DOCUMENTS

| | | | | |
|---|---|---|---|---|
| 4,840,821 A | * | 6/1989 | Miyazaki et al. | 427/430.1 |
| 4,903,717 A | | 2/1990 | Sumnitsch | 134/99 |
| 5,130,164 A | * | 7/1992 | Hutchison et al. | 427/123 |
| 5,230,743 A | * | 7/1993 | Thompson et al. | 134/32 |
| 5,377,708 A | * | 1/1995 | Bergman et al. | 134/105 |
| 5,513,668 A | | 5/1996 | Sumnitsch | 34/157 |
| 5,711,647 A | * | 1/1998 | Slocum | 414/751.1 |
| 5,762,391 A | | 6/1998 | Sumnitsch | 294/119.1 |

(List continued on next page.)

FOREIGN PATENT DOCUMENTS

| EP | 1 101 839 A2 | 5/2001 | C25D/7/12 |
|---|---|---|---|
| JP | 9-181026 | 7/1997 | H01L/21/304 |

OTHER PUBLICATIONS

C. Dundas et al., "Characterization of a Novel Method of Cleaning Wafer Back Sides and Effecting a Bevel Etch in a Single Processing Module," *Advanced Metallization Conference 1999 (AMC 1999)*—Orlando Florida, Sep. 28–30, 1999, pp. 637–641.

C.R. Simpson et al., "Reducing Edge and Bevel Contamination to Help Enhance Copper Process Yields," *Micro*, pp. 41–53 (Oct. 2000).

(List continued on next page.)

*Primary Examiner*—Shrive P. Beck
*Assistant Examiner*—Kirsten Crockford Jolley
(74) *Attorney, Agent, or Firm*—Townsend and Townsend and Crew

(57) ABSTRACT

An apparatus for and method of rinsing one side of a two-sided substrate and removing unwanted material from the substrate's edge and/or backside. One embodiment of the method is directed toward rinsing and cleaning a substrate having a front side upon which integrated circuits are to be formed and a backside. This embodiment includes dropping the substrate front side down onto a pool of rinsing liquid in a manner such that the front side of the substrate is in contact with the solution while the substrate is held in suspension by the surface tension of the solution liquid thereby preventing the backside of the substrate from sinking under an upper surface of the pool. Next, while the substrate is in suspension in said rinsing liquid, the substrate is secured by its edge with a first set of fingers and in some embodiments the substrate is subsequently spun. In another embodiment, a method of forming a copper layer on a front side of a substrate is disclosed. The method includes plating the copper layer over the front side of the substrate in a plating device and then transferring the substrate from the plating device to rinsing and cleaning station. At the rinsing and cleaning station, the substrate is dropped front side down onto a pool of rinsing liquid so that the surface tension of the liquid holds the substrate in suspension thereby preventing the backside of said substrate from sinking under an upper surface of the pool and then, while the substrate is suspended in the pool, it is secured with a first set of fingers.

23 Claims, 4 Drawing Sheets

U.S. PATENT DOCUMENTS

| | | | |
|---|---|---|---|
| 5,896,877 A | 4/1999 | Pirker | 134/153 |
| 5,904,164 A | 5/1999 | Wagner et al. | 134/148 |
| 5,931,518 A | 8/1999 | Pirker | 294/119.1 |
| 6,042,712 A * | 3/2000 | Mathieu | 205/209 |
| 6,056,825 A | 5/2000 | Sumnitsch | 118/730 |
| 6,149,759 A | 11/2000 | Guggenberger | 156/345 |
| 6,152,507 A | 11/2000 | Pirker | 294/64.3 |
| 6,162,739 A | 12/2000 | Sumnitsch et al. | 438/745 |
| 6,239,038 B1 * | 5/2001 | Wen | 438/745 |
| 6,309,981 B1 * | 10/2001 | Mayer et al. | 438/754 |
| 6,494,219 B1 | 12/2002 | Nayak et al. | |

OTHER PUBLICATIONS

P. Geraghty et al., "using Exclusion Ring Technology to Avoid CVD Tungsten Bevel Contamination," *Micro*, pp. 91–99 (Jul./Aug. 2000).

A.E. Braun, "ECP Technology," *Semiconductor International*, pp. 60–68 (May 2000).

* cited by examiner

_US 6,689,418 B2_

APPARATUS FOR WAFER RINSE AND CLEAN AND EDGE ETCHING

BACKGROUND OF THE INVENTION

Copper is becoming the conductor of choice for many integrated circuit manufacturers. Copper films exhibit better electromigration and stress-void resistance than aluminum, which was the primary conductor used by the semiconductor industry during the 1990's. The improved properties of copper enable manufacturers to reduce the RC time constant for circuits by either or both lowering the total resistance, R, of interconnect lines and decreasing the side-by-side capacitance of adjacent lines by decreasing the thickness of interconnect lines (i.e., reducing C while keeping R constant and carrying the same current in the smaller width line).

One method of forming a copper interconnect structure employs an electroplating process. In a typical copper electroplating process, a barrier layer of tantalum (Ta) or tantalum nitride (TaN) is first deposited over the substrate. Next, a seed layer, such as copper, is formed over the barrier layer. The copper seed layer can be formed using a variety of techniques including a chemical vapor deposition (CVD) process but is most often deposited using a physical vapor deposition (PVD) process. The substrate is then placed in a bath of an electrolyte plating solution and electric contact is made to the seed layer. Copper ions from the plating bath are attracted by the charge applied to the seed layer thereby forming a plated copper layer over the seed layer. After plating is completed, the substrate is typically transferred to a rinsing station where a solution of deionized water is applied to remove and neutralize any excess or remaining plating solution.

During the plating process, unwanted copper plating may occur on the edge and/or backside of the substrate. The extent of such unwanted plating depends in part on the formation of the seed layer. Some copper plating processes use a shadow mask or similar technique during deposition of the seed layer to exclude deposition from an outermost periphery, e.g., the outer 2 mm, of the substrate. FIGS. 1A and 1B show examples of plating processes that may result when deposition of the seed layer is excluded from the outer periphery of a substrate.

FIG. 1A shows a cross-sectional view of a substrate 10 that has a front side 12, a backside 14 and a beveled edge 16 between the front and backsides. In FIG. 1A, a seed layer 20, which stops short a distance A from beveled edge 16, has been deposited over front side 12 of the substrate. During the plating process, a copper layer 22 is formed over seed layer 20. Copper layer 22 forms only in portions of the substrate covered by seed layer 20. Thus, depending on the distance A from edge 16, copper layer 22 may form on edge 16 or may stop short of the edge as shown in FIG. 1A. In FIG. 1A, however, an excess build-up of copper plating, shown as an edge bead 24, forms at the edge of layer 22. Edge bead 24 typically results from locally higher current densities at the edge of seed layer 20 and usually forms within 2–5 mm of edge 16. Among other reasons, removal of edge bead 24 is generally desired to ensure uniform thickness of copper layer 22 on substrate 10.

FIG. 1B shows a cross-sectional view of another substrate 10 having similar front and backsides 12 and 14 and beveled edge 16. As in FIG. 1A, a copper layer 22 is electroplated over a seed layer 20 that stops a short distance A from beveled edge 16. Plated layer 22 includes a separated edge deposit 26, however, rather than a beaded edge. Separated edge deposit 26 is susceptible to separating from the substrate during subsequent processing since it is not secured to the seed layer. Such a separation may abrade and damage the substrate during a CMP or other subsequent step. Accordingly, removal of separated edge deposit 26 is also generally desirable.

As part of the efforts to realize increased profits from integrated circuit manufacturing processes, the usable area of the substrate is being pushed to the limit. To this end, techniques that limit the use of the outer periphery of the substrate are disfavored by some semiconductor manufacturers. One technique that attempts to maximize the usable area of the substrate during copper electroplating is to use a full-coverage seed layer. FIG. 1C shows a cross-sectional view of a substrate 10 that has such a full-coverage seed layer. Substrate 10 in FIG. 1C has a front side 12, a backside 14 and a beveled edge 16 between the front and backsides. A full-coverage seed layer 28 is deposited over the entire front side 12 as well as edge 16 and, sometimes, a small portion of backside 14. During the plating process to form copper layer 30, plating occurs on front side 12, on edge 16 (shown as portion 34) and possibly even on a small portion of backside 14. Also, an edge bead 32 sometimes forms for reasons similar to those discussed above with respect to FIG. 1A. Removal of portions 34 of layer 30 plated over edge 16 and/or backside 14 and bead 32 is generally desirable in order to limit contamination and particle problems that may otherwise result.

Accordingly, it can be seen that removing unwanted deposits from the edge and/or backside of the substrate is important to copper electroplating techniques. The industry has developed a number of different systems and techniques in order to accomplish the removal of such material. While some of these systems have been used quite successfully to remove unwanted material from the substrate's edge and/or backside, improved systems and techniques are still desirable.

SUMMARY OF THE INVENTION

Embodiments of the present invention provide an improved apparatus for and method of rinsing one side of a two-sided substrate and removing unwanted material from the substrate's edge and/or backside.

One embodiment of the method is directed toward rinsing and cleaning a substrate having a front side upon which integrated circuits are to be formed and a backside. This embodiment includes dropping the substrate front side down onto a pool of rinsing liquid in a manner such that the front side of the substrate is in contact with the solution while the substrate is held in suspension by the surface tension of the liquid thereby preventing the backside of the substrate from sinking under an upper surface of the pool. Next, while the substrate is in suspension in the rinsing liquid, the substrate is secured by its edge with a first set of fingers.

In another embodiment, a method of forming a copper layer on a front side of a substrate is disclosed. The method includes plating the copper layer over the front side of the substrate in a plating device and then transferring the substrate from the plating device to rinsing and cleaning station. At the rinsing and cleaning station, the substrate is dropped front side down onto a pool of rinsing liquid so that the surface tension of the liquid holds the substrate in suspension thereby preventing the backside of said substrate from sinking under an upper surface of the pool and then, while the substrate is suspended in the pool, it is secured by its edge with a first set of fingers.

In additional embodiments, after being secured by the first set of fingers the substrate is subsequently spun and a cleaning chemical is introduced to the backside of the substrate during a first time period. After the first time period, the substrate is secured by its edge with a second set of fingers and the first set of fingers is released. Additional cleaning chemical is then introduced to the backside of the substrate during a second time period. The cleaning chemical removes unwanted material from the substrate's edge and/or backside.

These and other embodiments of the present invention, as well as its advantages and features, are described in more detail in conjunction with the text below and attached figures.

The above figures are not intended to be drawn to scale. Certain features shown in the figures have been exaggerated to better illustrate the features or specific issues.

DESCRIPTION OF THE SPECIFIC EMBODIMENTS

I. Introduction

Embodiments of the present invention relates to an improved method of and apparatus for removing unwanted material from a substrate's edge and/or backside. Specific embodiments are particularly useful in removing unwanted copper material after an electroplating process but may also be used to remove other unwanted deposition material such as tungsten or similar metals.

Figure 1A:
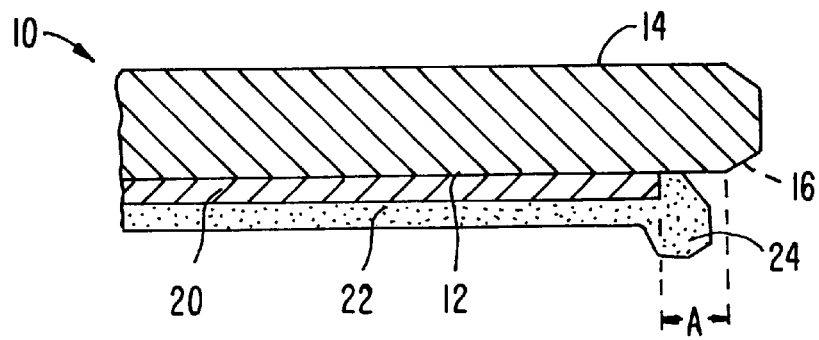
FIG. 1A shows a simplified cross-sectional views of a substrate after an edge bead forms during a plating process that excludes deposition of a seed layer from the outer periphery of the substrate.
Figure 1B:
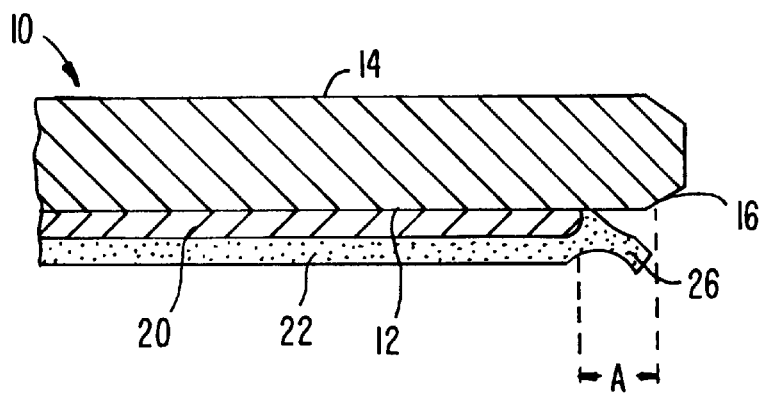
FIG. 1B shows a simplified cross-sectional views of a substrate after a separated edge deposit forms during a plating process that excludes deposition of a seed layer from the outer periphery of the substrate.
Figure 1C:
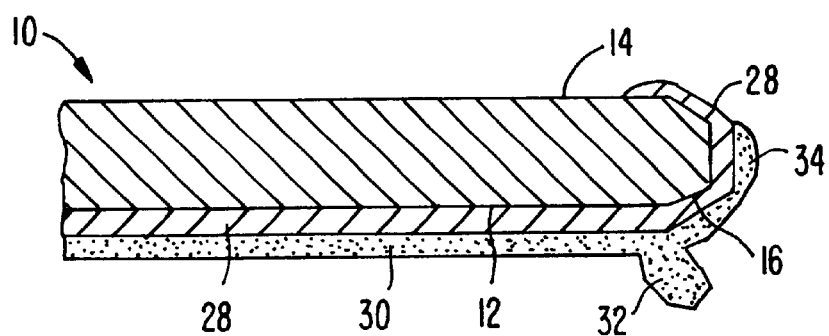
FIG. 1C shows a simplified cross-sectional view of a substrate after an edge bead forms during a plating process that employs a full-coverage seed layer.
Figure 2:
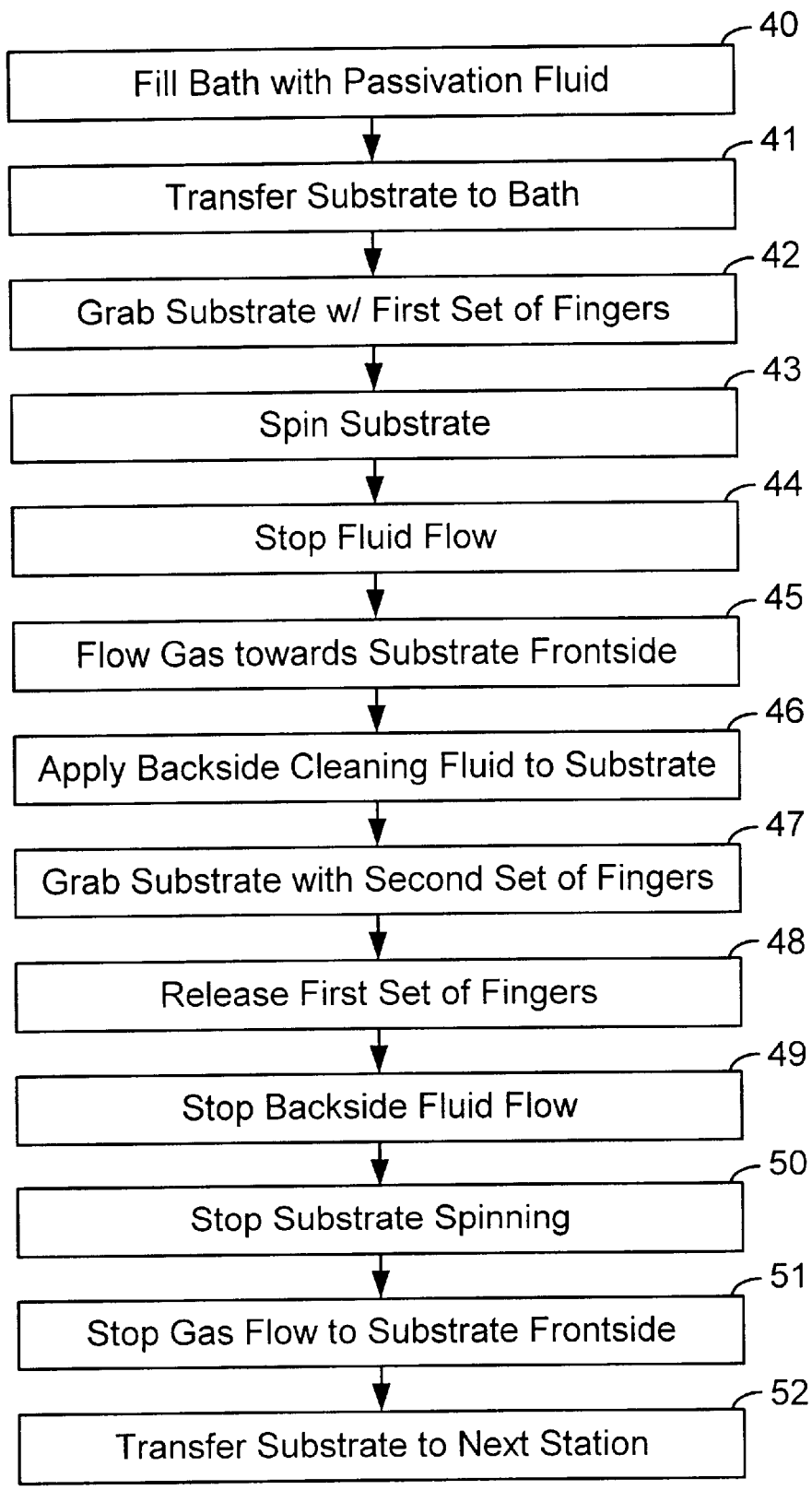
FIG. 2 is a flowchart illustrating the steps of one embodiment of the method of the present invention.
Figure 3A:
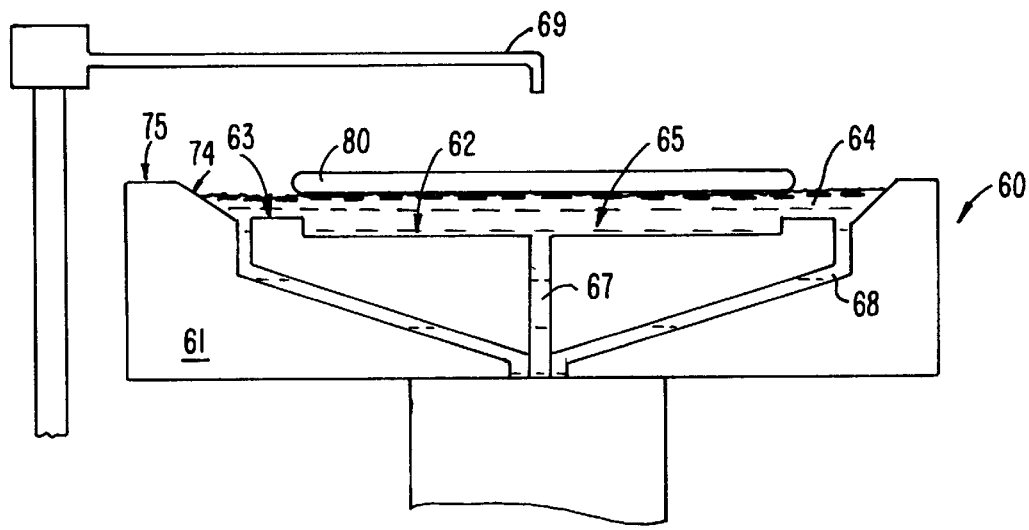
FIG. 3A is a simplified cross-sectional view of one embodiment of the apparatus according to one embodiment of the present invention.
Figure 3B:
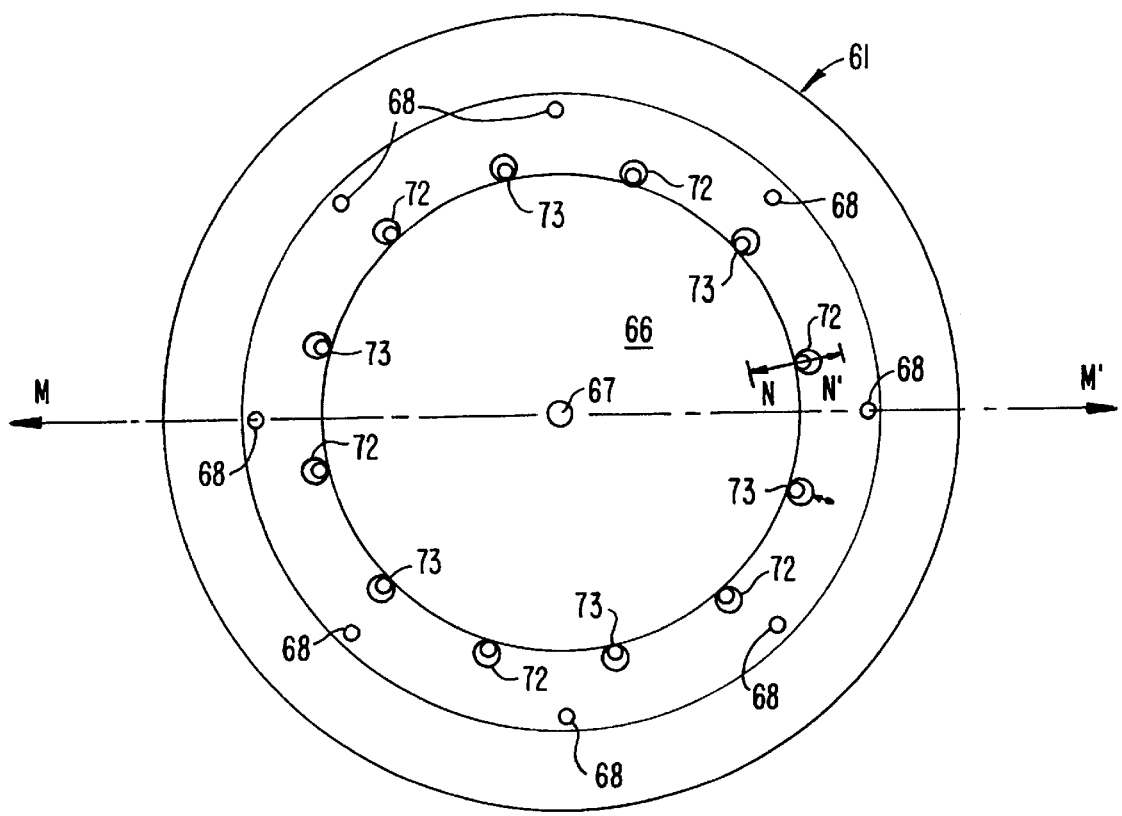
FIG. 3B is a simplified top plan view of the apparatus shown in FIG. 3A.
Figure 3C:
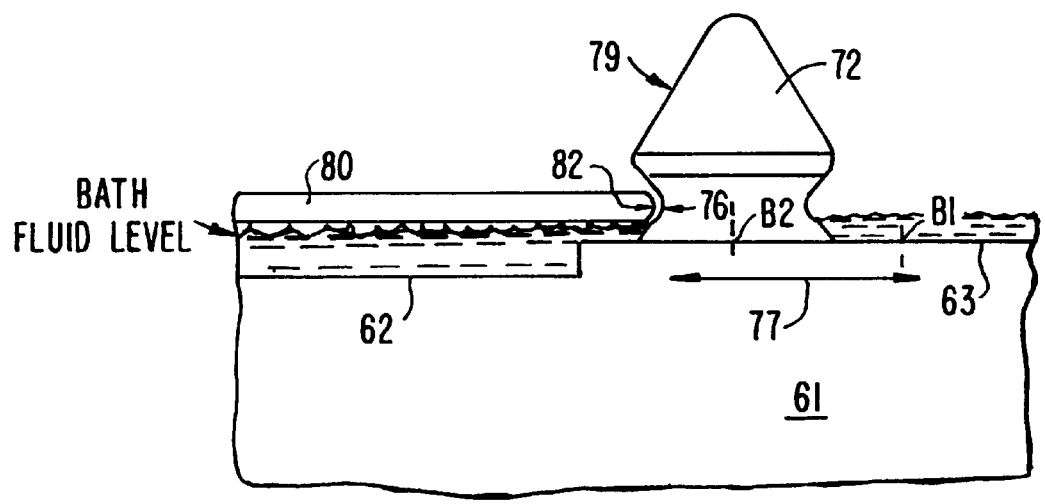
FIG. 3C is a simplified, enlarged cross-sectional view of a portion of the apparatus shown in FIGS. 3A and 3B.

In order to better understand and appreciate embodiments of the invention, reference is made below to FIGS. 2 and 3A–3C. FIG. 2 is a flow chart illustrating the steps of one embodiment of the method of the present invention and FIGS. 3A–3C are a simplified views of one embodiment of a substrate receiving and edge cleaning apparatus 60 according to the present invention. In some embodiments, substrate receiving apparatus 60 is part of an integrated, multi-station substrate processing system that performs the copper electroplating process. In such an integrated, multi-station substrate processing system, substrates may be transferred from one station to another by a central robot.

FIG. 3A is a simplified cross-sectional view of substrate receiving apparatus 60 taken along line M–M' of FIG. 3B. As shown in FIG. 3A, apparatus 60 includes a chuck 61 that has a recessed surface 62 surrounded by a raised surface 63. Surface 62 and an inner periphery of surface 63 constitute a centered part of a substrate receiving portion 65 that is bounded by angular walls 74 extending from an outer periphery of surface 63 to an upper peripheral surface 75 of chuck 61. In one embodiment, surface 63 is between 2–10 millimeters above surface 62. Also shown in FIG. 3A are a fluid channel 67 centered in recessed surface 62 and fluid drains 68 spaced evenly around a periphery of surface 63. Fluid channel 67 is coupled, through appropriate flow control valves (not shown) and separate branching fluid lines (also not shown), to a container of a rinsing liquid and to a source of gas. The flow control valves enable either the solution or gas to be separately delivered to through fluid line 67 to substrate receiving portion 65. In other embodiments, separate fluid channels exist to introduce liquid and gas to substrate receiving portion 65.

Rinsing liquid pumped to substrate receiving portion 65 first fills recessed region 62 before spilling onto surface 63 where it can be drained from drains. In this manner, a flow of liquid that extends radially from the center of surface 62 towards the periphery of surface 63 is created. Drains 68 are fluidly coupled through appropriate control valves (not shown) to an appropriate fluid collection system where used rinsing liquid is captured and stored for subsequent treatment and disposal. Walls 74 contain fluid within substrate receiving portion 65.

Prior to transferring a substrate to apparatus 60 after a plating operation, a bath of rinsing liquid 64 is formed in a substrate receiving portion 65 of chuck 61 by opening the appropriate flow control valves to allow the rinsing liquid to flow through channel 67 into substrate receiving portion 65 (FIG. 2, step 40). The level of bath 64 is controlled by regulating the rate of liquid pumped through channel 67 versus the rate of liquid drained through channels 68. In other embodiments, bath 64 is kept stagnant at this stage by closing drains 68 and stopping the flow of rinsing liquid into substrate receiving portion 65 when it reaches a desired level.

Once bath 64 is prepared, a substrate 80 is transferred to apparatus 60 and placed face down onto the bath in a manner such that the surface tension of the solution along the substrate's edge holds the substrate in suspension in the bath (FIG. 2, step 41). Generally this is accomplished by positioning the substrate parallel to bath 64 and dropping it onto the bath from a short distance above the bath (e.g., between 1 and 10 mm). The substrate can be transferred to chuck 61 using any of a number of well known substrate transfer methods such as picking the substrate up by its backside with a vacuum clamp attached to a robotic transfer arm.

Referring now to FIG. 3B, as substrate 80 is lowered onto bath 64, fingers 72 and 73 which protrude from surface 63 center the substrate in the substrate receiving area. Fingers 72 and 73 are made from PVDF or a similar material and include angled upper surface 79 (see FIG. 3C, which is a simplified cross-sectional view of chuck 61 along lines N–N' of FIG. 3B) that facilitates the centering of substrate 80. Sets of fingers 72 and 73 can be independently actuated to move along a path 77 on surface 63 toward and away from the center of chuck 61, for example, between points B1 and B2. Once substrate 80 is floated on bath 64, the substrate is grabbed on its edge by first set of fingers 72 (FIG. 2, step 42) by moving the fingers toward the center of the chuck from point B1 to point B2. Typically, the level of bath 64 is such that while the substrate is suspended on the bath, edge 82 of the substrate is somewhere within indentation 76 of the fingers. In some embodiments, grabbing the substrate with fingers 72 may also include raising or lowering the level of bath 64 as appropriate.

Placing the substrate face down in bath 64 neutralizes and removes any of the copper electrolyte solution remaining from the plating step. In one embodiment, the rinsing liquid used in bath 64 comprises deionized water. Chuck 61 is operatively coupled to a motor (not shown) that can spin the chuck at speeds up to 5000 revolutions per minute (rpm) in one embodiment. Thus, once the substrate is secured by fingers 72 it can be spun (the motor spins chuck 61 and fingers 72 attached thereto thereby spinning substrate 80) to further rinse the plating solution from substrate 80 (FIG. 2, step 43). This initial spinning step may include reversing the spin direction one or more times to improve the effectiveness of the rinsing step. As the substrate is spun centrifugal force forces rinsing solution from bath 64 to spill out over upper peripheral surface 75 where it is collected in a splash cup or similar device along with the cleaning fluid introduced in step 46 and described below. In some embodiments bath 64 is in a flowing condition so that rinsing liquid is continuously supplied to substrate receiving portion 65, and in one embodiment this initial spin/rinse step lasts between 15–30 seconds.

After the initial rinse step, the flow of rinsing fluid to substrate receiving portion 65 is stopped in preparation for the backside cleaning process (FIG. 2, step 44). Typically, there is little or no rinsing liquid from bath 64 remaining in substrate receiving area 65 at this stage. Next as the substrate is spun, a flow of molecular nitrogen ($N_2$) or a similar gas is introduced to the front side of substrate 80 through fluid channel 67 (FIG. 2, step 45) and a cleaning fluid is introduced to the backside of the substrate from a dispenser 69 (FIG. 2, step 46). In one embodiment the cleaning fluid is a mixture of sulfuric acid and hydrogen peroxide. In other embodiments, nitric acid, citric acid or similar cleaning fluids may be used.

Figure 4:
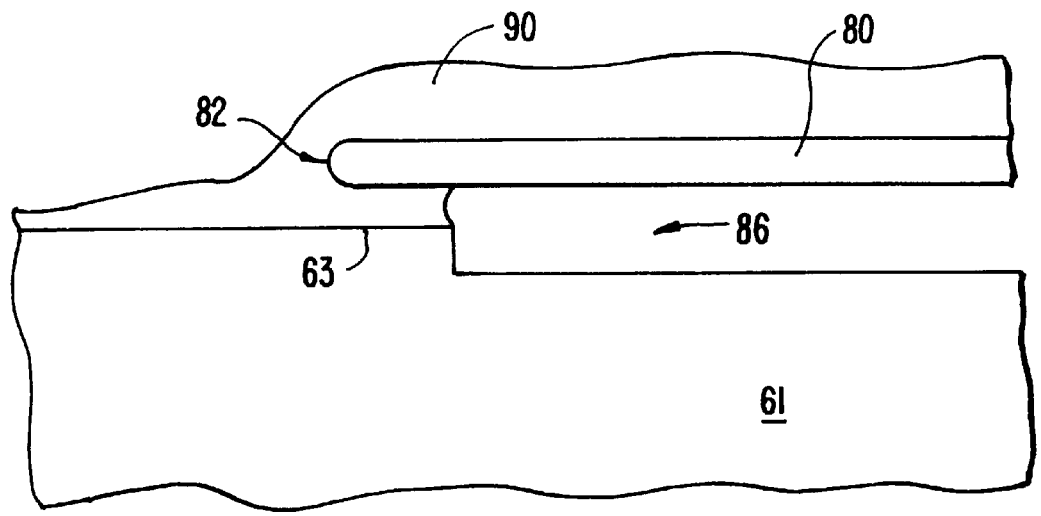
FIG. 4 is a simplified cross-sectional view of a portion of the apparatus shown in FIGS. 3A–3C showing how cleaning fluid applied to a substrate's backside can etch the substrate's edge as well as a portion of the substrate frontside.

FIG. 4 shows a cleaning fluid 90 applied to a portion of a backside of substrate 80. As shown in FIG. 4, the cleaning fluid can be controlled to wrap-around the beveled edge 82 of substrate 80 to the front side of the substrate to remove a controlled amount of copper from the bevel and the outer periphery of the front side. The location of the copper etched (i.e., the amount of cleaning fluid wrap-around) can be controlled by rotation speed, by capillary action of the fluid and surfaces close to the wafer surface and opposing gas pressure on the front side of the substrate represented by arrow 86. The shorter distance between substrate 80 and area 63 of chuck 61 (between 0.5 and 1.0 millimeters in one embodiment), as opposed to recessed area 62, creates a capillary effect near the outer periphery of substrate 80 that enables better control over the amount of fluid wrap-around. Gas pressure is controlled by mass flow controllers (not shown) or similar valves operatively coupled to a gas tank (e.g., $N_2$).

The areas of the substrate edge 82 that fingers 72 use to secure substrate 80 during the spinning operation are in mechanical contact with fingers 72 and thus may not be adequately exposed to cleaning solution during step 46. Thus, after a first cleaning period, a second set of fingers 73 are actuated to secure substrate 62 (FIG. 2, step 47) and the first set of fingers 72 are released (FIG. 2, step 48). Actuating the second set of fingers 73 includes moving them toward the center of chuck 61 from position B1 to B2 until they contact substrate edge 82 and releasing first set of fingers 72 includes moving them away from the center of chuck 61 back to position B1 so they no longer contact substrate 80.

During this time chuck 61 and substrate 80 are continuously spun and cleaning solution is continuously dispensed to the backside of the substrate. Because fingers 72 and 73 can be actuating while chuck 61 is spinning independent of the chuck's rotation, an electric feed through that carries the signal to actuate and release the fingers comprises an electric rotary feed through that can be purchased from manufacturers such as Mercotac, Inc. or Electrotech Controls, Ltd. In other embodiments, fingers 72 and 73 can be pneumatically activated using appropriate rotary feed through actuators manufactured by companies such as Duff-Norton or Deublin.

After completion of a second cleaning period that is long enough to remove copper build-up in the areas where first set of fingers 72 came in contact with substrate 80, flow of the cleaning solution to the substrate's backside is stopped (FIG. 2, step 49). The chuck is then stopped from spinning (FIG. 2, step 50) and the flow of nitrogen to the front of substrate 80 is stopped (FIG. 2, step 51). The substrate is then ready to be transferred to a next processing station (FIG. 2, step 52) using the same or a similar substrate transfer method as used to transfer the substrate to chuck 61. This may include, for example, securing the backside of the substrate with a vacuum clamp attached to a robotic transfer arm, releasing second set of fingers 73 and then transferring substrate 80 to a next processing station.

Although not shown in FIGS. 3A–3C, apparatus 60 includes a controller that controls the timing of the various steps 40–52 by transmitting control signals to the operative components of apparatus 60 to carry-out the functions required by each step.

Having fully described several embodiments of the present invention, other equivalent or alternative methods of practicing the present invention will be apparent to those skilled in the art. For example, while the method of the present invention was described as including both passivation and edge and backside cleaning steps, some embodiments of the invention only employ the substrate rinsing/passivation step where the substrate is dropped face down into a bath of rinsing solution and then subsequently spun to remove the rinsing solution from front surface thereby drying the substrate. Gas flow to the front side of the substrate is optional in these embodiments and these embodiments do not require steps 46, 47, 48 and 49. Also, these embodiments do not require two or more independently actuated sets of fingers 72 and 73. Instead, a single set of fingers may grab the substrate and then subsequently release the substrate when it is to be transferred to a next station 74. Instead, a single set of fingers may grab the substrate and then subsequently release the substrate when it is to be transferred to a next station.

A person of skill in the art will also appreciate that the order of many of the steps set forth in FIG. 2 can be changed in other embodiments of the invention. For example, steps 44, 45 and 46 can start substantially simultaneously in some embodiments. Similarly, steps 49, 50 and 51 can be substantially simultaneous or their order can be readily be altered. Additionally, while the application describes securing the substrate with a specific design of fingers 72 and 73 during steps 42 and 47, the substrate can be secured with mechanical devices that differ from the fingers shown in FIG. 3C. As used herein the term "fingers" is intended to represent any mechanical device that can be used to grab and secure substrate 80 by its edge such that the substrate can be subsequently spun with chuck 61 during chemical clean step 46. In still other embodiments, chuck 61 does not include fluid drains 68. Instead, the initial level of bath 64 is controlled by the amount of fluid introduced to substrate receiving portion 65 and the bath is emptied by centrifugal force. These and other embodiments are intended to be within the scope of the present invention which is only intended to be limited by the claims listed below.

What is claimed is:

1. A method for rinsing a substrate having a front side upon which integrated circuits are to be formed, a backside and an edge, said method comprising:

dropping the substrate front side down onto a pool of liquid in a manner such that the substrate is held in suspension by the surface tension of the liquid thereby preventing the backside of said substrate from sinking under an upper surface of said pool; and securing the substrate by its edge with a first set of fingers while the substrate is in suspension in said liquid.

2. The method of claim 1 wherein said liquid comprises deionized water.

3. The method of claim 1 further comprising spinning the substrate after the substrate is secured with the first set of fingers.

4. The method of claim 1 wherein said liquid comprises deionized water.

5. The method of claim 3 wherein said step of spinning the substrate further comprises spinning the substrate in a first direction and then reversing the substrate to spin in a second, opposite direction.

6. The method of claim 5 wherein the direction said substrate is spun is reversed multiple times.

7. The method of claim 5 wherein said liquid is rinsing liquid and during at least one initial alternating direction spin cycle, rinsing liquid is continuously flowed to the front side of the substrate.

8. The method of claim 7 wherein the flow of rinsing liquid is stopped prior to introducing a cleaning chemical to the backside of said substrate.

9. The method of claim 1 wherein said substrate is dropped onto said pool of liquid from a distance of 10 millimeters or less.

10. The method of claim 8 wherein said cleaning chemical comprises one or more of sulfuric acid, nitric acid or citric acid.

11. A method of forming a copper layer on a front side of a substrate, said method comprising:

(a) plating the copper layer over the front side of the substrate in a plating device;

(b) transferring the substrate from the plating device to rinsing and cleaning station;

(c) at the rinsing and cleaning station, dropping the substrate front side down onto a pool of rinsing liquid so that the surface tension of the liquid holds the substrate in suspension thereby preventing the backside of said substrate from sinking under an upper surface of the pool; and (d) securing the substrate with a first set of fingers while the substrate is in suspension in the pool.

12. The method of claim 11 further comprising, prior to forming said copper layer, depositing a seed layer over the substrate using a chemical or physical vapor deposition process in a second substrate processing chamber and transferring said substrate from said second substrate processing chamber to said first substrate processing chamber.

13. The method of claim 11 wherein said rinsing liquid comprises deionized water.

14. The method of claim 11 wherein said substrate is dropped onto said pool of liquid from a distance of 10 millimeters or less.

15. A method for rinsing a substrate having a front side upon which integrated circuits are to be formed, a backside and an edge, said method comprising:

dropping the substrate front side down onto a pool of liquid in a manner such that the substrate is held in suspension by the surface tension of the liquid thereby preventing the backside of said substrate from sinking under an upper surface of said pool;

securing the substrate by its edge with a first set of fingers while the substrate is in suspension in said liquid;

spinning the substrate after the substrate is secured with the first set of fingers; and while said substrate is spinning:
        (i) introducing a cleaning chemical to the backside of said substrate;
        (ii) thereafter, securing the substrate by its edge with a second set of fingers and releasing said first set of fingers; and
        (iii) thereafter, introducing said cleaning chemical to the backside of said substrate.

16. The method of claim 15 wherein said liquid comprises deionized water.

17. The method of claim 15 wherein said step of spinning the substrate further comprises spinning the substrate in a first direction and then reversing the substrate to spin in a second, opposite direction.

18. The method of claim 17 wherein the direction said substrate is spun is reversed multiple times.

19. The method of claim 17 wherein said liquid is rinsing liquid and during at least one initial alternating direction spin cycle, rinsing liquid is continuously flowed to the front side of the substrate.

20. The method of claim 19 wherein the flow of rinsing liquid is stopped prior to introducing said cleaning chemical to the backside of said substrate.

21. The method of claim 15 wherein said cleaning chemical comprises one or more of sulfuric acid, nitric acid or citric acid.

22. A method of forming a copper layer on a front side of a substrate, said method comprising:

(a) plating the copper layer over the front side of the substrate in a plating device;

(b) transferring the substrate from the plating device to rinsing and cleaning station;

(c) at the rinsing and cleaning station, dropping the substrate front side down onto a pool of rinsing liquid so that the surface tension of the liquid holds the substrate in suspension thereby preventing the backside of said substrate from sinking under an upper surface of the pool;

(d) securing the substrate with a first set of fingers while the substrate is in suspension in the pool;

(e) spinning the substrate; and while said substrate is spinning:
        (i) introducing a cleaning chemical to the backside of said substrate;
        (ii) thereafter, securing the substrate with a second set of fingers and releasing said first set of fingers; and
        (iii) thereafter, introducing said cleaning chemical to the backside of said substrate.

23. The method of claim 22 wherein said cleaning chemical comprises one or more of sulfuric acid, nitric acid or citric acid.

* * * * *